(12) United States Patent
Oberste-Ufer et al.

(10) Patent No.: US 12,743,919 B2
(45) Date of Patent: Sep. 22, 2026

(54) METHOD FOR INSTALLING A PLURALITY OF DOOR COMPONENTS

(71) Applicants: DORMAKABA DEUTSCHLAND GMBH, Ennepetal (DE); DORMAKABA INTERNATIONAL HOLDING GMBH, Ennepetal (DE); DORMAKABA SCHWEIZ AG, Rümlang (CH)

(72) Inventors: Kai Oberste-Ufer, Ennepetal (DE); Daniel Fischer, Rümlang (CH); Thomas Vogler, Ennepetal (DE); Sven Busch, Ennepetal (DE); Ingo Halder, Ennepetal (DE); Bernd Gehrmann, Ennepetal (DE); Andrzej Dudzinski, Ennepetal (DE); Chandra Prakash Gupta, Ennepetal (DE); Oliver Borchmann, Ennepetal (DE); Frank Lorenz, Rümlang (CH); Jürg Simon, Rümlang (CH)

(73) Assignees: DORMAKABA DEUTSCHLAND GMBH, Ennepetal (DE); DORMAKABA INTERNATIONAL HOLDING GMBH, Ennepetal (DE); DORMAKABA SCHWEIZ AG, Rumlang (CH)

( * ) Notice: Subject to any disclaimer, the term of this patent is extended or adjusted under 35 U.S.C. 154(b) by 118 days.

(21) Appl. No.: 18/547,293

(22) PCT Filed: Feb. 23, 2022

(86) PCT No.: PCT/EP2022/054510
§ 371 (c)(1),
(2) Date: Aug. 21, 2023

(87) PCT Pub. No.: WO2022/180088
PCT Pub. Date: Sep. 1, 2022

(65) Prior Publication Data

US 2024/0127653 A1 Apr. 18, 2024

(30) Foreign Application Priority Data

Feb. 24, 2021 (EP) .................................... 21159058
Aug. 19, 2021 (WO) ................ PCT/EP2021/073068

(51) Int. Cl.
*G06F 30/13* (2020.01)
*G06Q 50/08* (2012.01)
(Continued)

(52) U.S. Cl.
CPC ............... *G07C 9/28* (2020.01); *G06F 30/13* (2020.01); *G06Q 50/08* (2013.01); *G08B 7/066* (2013.01)

(58) Field of Classification Search
CPC ...... G08B 7/066; G08B 13/08; G08B 25/006; G08B 25/007; G08B 25/018;
(Continued)

(56) References Cited

U.S. PATENT DOCUMENTS

2014/0095122 A1* 4/2014 Appleman ............ G06T 19/003 703/1
2020/0226223 A1 7/2020 Reichl
2022/0010612 A1* 1/2022 Scamarcia ............ E06B 3/7015

FOREIGN PATENT DOCUMENTS

CH 714707 A1 9/2019
CN 110998053 A 4/2020
(Continued)

OTHER PUBLICATIONS

International Search Report for International Application No. PCT/EP2022/054510, dated Jun. 2, 2022, 2 pages.
(Continued)

*Primary Examiner* — Dionne Pendleton
(74) *Attorney, Agent, or Firm* — CANTOR COLBURN LLP

(57) ABSTRACT

A method for installing door components includes at least the following steps: a. providing at least one preconfigured door system type by way of an electronic configuration system for selection by a user, wherein the at least one preconfigured door system type is able to be retrieved from
(Continued)

a database by way of the electronic configuration system, wherein at least one preconfigured door system type is able to be preselected by the configuration system by way of at least one technical and/or functional user specification, wherein the door system type contains stipulated door component types, and b. electronically providing preconfigured technical data of the selected door system type in order to carry out the installation on site.

14 Claims, 3 Drawing Sheets

(51) Int. Cl.
*G07C 9/28* (2020.01)
*G08B 7/06* (2006.01)

(58) Field of Classification Search
CPC .................. G08B 25/003; G08B 25/10; G07C 2009/00769; G07C 9/00174; G07C 9/00563; G07C 9/28; G07C 9/27; G07C 9/22; G07C 9/00309; G07C 2209/02; G07C 9/15; G07C 2209/63; G07C 9/00571; G07C 9/20; G07C 9/37; G07C 9/00904; G07C 9/10; G07C 9/23; G07C 9/32; G07C 9/38; G07C 2009/00793; G07C 2209/64; G07C 9/00896; G07C 9/00944; G07C 9/21; G07C 9/25; G07C 9/29; G06Q 30/0621; G06Q 50/08; G06Q 10/02; G06Q 10/047; G06Q 10/0833; G06Q 10/087; G06Q 10/40; G06Q 20/3674; G06Q 20/382; G06Q 30/00; G06Q 30/02; G06Q 30/0205; G06Q 30/0261; G06Q 30/06; G06Q 30/0601; G06Q 30/0613; G06Q 30/0623; G06Q 30/08; G06Q 40/04; G06F 30/13; G06F 3/017; G06F 21/35; G06F 3/167; G06F 21/32; G06F 3/14; G06F 1/163; G06F 1/1694; G06F 21/31; G06F 21/316; G06F 21/44; G06F 21/554; G06F 2111/18; G06F 2221/034; G06F 3/0346; G06F 3/0484; G06F 3/04847; G06F 3/147; G06F 30/12; G06T 19/003; G06T 19/20; G06T 2210/04; G06T 19/006; G06T 15/06; G06T 2210/12; G06T 2219/2004; E06B 2003/7026; E06B 2003/704; E06B 2003/7042; E06B 2003/7049; E06B 2003/7059; E06B 3/7015; E06B 3/822; E06B 5/16; E06B 5/164; E06B 3/46; E05F 15/77; E05F 15/70; E05F 15/73; E05F 15/603; E05F 15/63; E05F 15/76; E05F 15/40; E05F 15/41; E05F 15/79; E05F 2015/765; E05F 15/00; E05F 15/43; E05F 15/665; E05F 15/71; E05F 17/00; E05F 2015/767; E05F 2017/005; E05F 15/60; E05F 15/611; E05F 15/72; E05F 15/75; E05F 2015/763; E05Y 2400/44; E05Y 2800/21; E05Y 2900/132; E05Y 2400/10; E05Y 2400/31; E05Y 2400/36; E05Y 2400/37; E05Y 2400/41; E05Y 2400/45; E05Y 2400/456; E05Y 2400/458; E05Y 2400/66; E05Y 2800/409; E05Y 2800/422; E05Y 2400/50; E05Y 2400/502; E05Y 2400/81; E05Y 2400/8505; E05Y 2400/8515; E05Y 2400/852; E05Y 2900/50; E05Y 2400/32; E05Y 2400/324; E05Y 2400/40; E05Y 2400/42; E05Y 2400/54; E05Y 2400/80; E05Y 2400/86; E05Y 2800/70; E05Y 2900/106; E05Y 2900/108; E05Y 2900/11; E05Y 2900/531; E05Y 2400/454; E05Y 2400/52; E05Y 2400/85; E05Y 2400/851; E05Y 2400/856; E05Y 2800/254; E05Y 2800/30; E05Y 2900/518; B66B 1/468; B66B 2201/4676; B66B 1/2408; B66B 1/3461; B66B 13/165; B66B 2201/23; B66B 2201/401; B66B 2201/402; B66B 2201/405; B66B 2201/4653; B66B 3/002; B66B 1/2458; B66B 1/463; B66B 2201/4607; B66B 2201/4615; B66B 2201/463; B66B 2201/4646; B66B 2201/4661; G05B 19/0426; G05B 2219/25112; G05B 2219/2628; G05B 1/01; G05B 19/042; G05B 2219/40062; G05B 15/02; G05B 19/0425; G05B 19/409; G05B 2219/23258; G05B 2219/2642; A63F 13/30; A63F 13/335; A63F 13/35; A63F 13/533; A63F 13/79; A63F 13/795; A63F 13/847; A63F 13/87; A63F 2300/407; A63F 2300/51; A63F 2300/5533; A63F 13/792; A63F 2300/5506; A63F 2300/5513; A63F 2300/572; A63F 2300/61; A63F 2300/8064; E05B 47/0012; E05B 49/00; E05B 65/108; E05B 77/48; E05B 81/56; E05B 81/77; B64D 11/003; B64D 11/0015; B64D 2013/0614; B64D 2221/00; H04W 88/02; H04W 12/08; H04W 4/33; H04W 4/80; H04W 40/244; H04W 88/085; B61D 19/00; B61L 15/0081; B64C 1/00; B64C 1/36; B65D 25/20; G06K 7/087; G06K 7/10366; G06K 19/06037; G06K 7/10861; G01V 5/224; G06N 20/00; G06V 20/56; G06V 20/59; G06V 20/20; G06V 20/52; G06V 2201/05; G06V 40/10; G09F 23/06; G09F 27/005; G09F 9/30; G09F 11/00; G09F 11/02; G09F 11/23; G09F 19/02; G09F 2023/025; G09F 23/0091; G09F 23/065; G09F 23/08; G09F 9/372; G09F 9/375; H05K 7/1489; H05K 7/18; H05K 7/183; H05K 7/20545; H05K 7/20709; G09G 3/344; G09G 2340/12; G09G 2354/00; G09G 3/001; A47C 31/008; A47G 19/2227; B60N 2/0237; B60N 2/0244; B60N 2/0264; B60R 2325/101; B60R 2325/205; B60R 25/01; B60R 25/2045; B60R 25/245; B60R 25/246; F24F 11/0001; F24F 11/30; F24F 11/46; F24F 11/52; F24F 11/523; F24F 11/526; F24F 11/57; F24F 11/58; F24F 11/61; F24F 11/62; F24F 11/64; F24F 2110/10; F24F 2120/10; G01C 21/3632; G01C 21/3641; G01C 21/365; G01T 1/167; G05D 23/1904; G05D 23/1905; G07B 15/00; G07F 13/00; G07F 17/0057; G07F 17/323; G07F 17/3258; G08C 17/02; G08C 2201/32; G08C 2201/93; H03K 17/945; H03K 2217/94005; G08G 1/202; H04B 17/23; H04B 17/309; H04L 12/2832; H04L 41/22; H04L 67/06; H04L 67/12; H04L 67/306; H04L 67/60; H04N 21/41422; H04N 21/472; H04M 1/72412; H04M 1/72454; H05B 47/175; H05B 47/196

See application file for complete search history.

(56) References Cited

FOREIGN PATENT DOCUMENTS

| | | | |
|---|---|---|---|
| EP | 1191465 | A1 | 3/2002 |
| EP | 3267451 | A1 | 1/2018 |
| EP | 3349189 | A1 | 7/2018 |
| JP | 2006131188 | A | 5/2006 |
| WO | 2011095474 | A1 | 8/2011 |

OTHER PUBLICATIONS

Written Opinion for International Application No. PCT/EP2022/054510, dated Jun. 2, 2022, 3 pages.

Chinese Office Action for Application No. 202280023484.4, dated Jul. 4, 2026, 17 pages with translation.

Singapore Office Action for Application No. 11202306249X, dated Mar. 13, 2026, 9 pages.

* cited by examiner

METHOD FOR INSTALLING A PLURALITY OF DOOR COMPONENTS

CROSS-REFERENCE TO RELATED APPLICATIONS

This application is a 35 U.S.C. § 371 National Stage patent application of PCT/EP2022/054510, filed on 23 Feb. 2022, which claims the benefit of International Application No. PCT/EP2021/073068, filed on 19 Aug. 2021, which claims the benefit of European patent application 21159058.3, filed on 24 Feb. 2021, the disclosures of which are incorporated herein by reference in their entirety.

TECHNICAL FIELD

The disclosure relates to a method for installing a plurality of door components.

BACKGROUND

In hospitals, for example, a plurality of door components are arranged one behind the other or together on a door. When planning such door component installations, it may happen that some door components are not consistent with other door components or the door components are installed incorrectly. In the case of escape route doors, for example, this circumstance harbors the risk that, for example, one of the escape route doors will not open even though this would be necessary. On the other hand, for example, one of the fire protection doors could remain open, although they would all have to be closed in the event of a fire. Another security risk arises if, for example, access control does not work as intended.

SUMMARY

The disclosure provides a method for installing door components which ensures that the door components used are consistently adjusted to one another and/or which is improved in terms of security. It is also the object of the disclosure to provide a computer program product which enables an installation method which is improved in terms of security. It is also the object of the disclosure to provide a computing unit or an access system with a computing unit, with which a security-related installation method can be carried out.

The advantage is achieved by providing a method having the features of claim 1. Advantageous further developments of the method are indicated in the dependent claims, the description and in the figures. Features and details that are described in connection with the method according to the disclosure thereby also apply in connection with a computer program product according to the disclosure and/or an access system according to the disclosure and/or a computing unit according to the disclosure and vice versa. In particular, placed under protection are a computer program product with which a method according to the disclosure, in particular a method according to one of claims 1 to 13, can be carried out and/or a computing unit and/or an access system with which a method according to the disclosure, in particular a method according to one of claims 1 to 13, can be carried out. The access system according to the disclosure can comprise the computing unit according to the disclosure. Furthermore, the access system and/or the computing unit can comprise at least one electronic memory as a computer-readable medium on which the computer program according to the disclosure is stored.

In this case, the features mentioned in the description and in the claims may each be essential to the disclosure individually by themselves or in combination. The description additionally characterizes and specifies the disclosure, in particular in connection with the figures.

A method for installing a plurality of door components will be indicated.

The method according to the disclosure comprises at least the following steps:

a. providing at least one preconfigured door system type by way of an electronic configuration system for selection by a user,
    - with the at least one preconfigured door system type being able to be retrieved from a database by the electronic configuration system,
    - with at least one preconfigured door system type being able to be preselected by the configuration system by way of at least one technical and/or functional user specification,
    - with the door system type containing a plurality of defined door component types, b. electronic provision of preconfigured technical data of the selected door system type in order to carry out the installation on site.

According to the disclosure, the configuration system provides door system types. The door system types each comprise a plurality of defined door component types. A door component type is defined in particular by the function that the door component type has in relation to the door on which the door component corresponding to the door component type is to be installed.

The function can comprise changing a door state. The change of the door state can e.g. correspond to opening the door, closing the door, unlocking the door, locking the door, providing a state for manually unlocking and/or locking, opening and/or closing the door.

For example, the door component that corresponds to the door component type can be a motorized door drive. The motorized door drive can effect a motorized opening and/or closing of the door. In another example, the door component that corresponds to the door component type can be designed as an electrically actuatable locking element, e.g. a motor lock, a motorized lock cylinder or an electromagnetic door lock. The electrically actuatable locking element can effect unlocking and/or locking of the door. In a further example, the door component that corresponds to the door component types can be designed as an electric door opener. The electric door opener can assume a state in which manual actuation of the door unlocks and simultaneously opens the door, while in another state of the door opener, manual actuation of the door and thus unlocking and opening of the door is prevented. Other examples of door components for providing a state for manually unlocking a door can be seen in electromechanical lock cylinders and/or electromechanical fittings, each of which also corresponds to a door component type.

The function can comprise signal generation for changing the door state. For example, the door component that corresponds to the door component type can generate a signal, with the signal causing another door component, e.g. the motorized door drive, the locking element and/or the door opener, to change the door state. A door component of this type is referred to as a signal transmitter. For example, the door component that corresponds to the door component type can be designed as a sensor that detects a person approaching the door. In another example, the door component that corresponds to the door component type can be designed as a manual button or as a key button, which a user actuates to transmit their opening request to the door system. In a further example, the door component that corresponds to the door component type can be designed as a hazard detector, for example a smoke detector. The signal transmitter can be designed, for example, as an escape route controller, with the escape route controller detecting the actuation of an emergency button and generating a signal that the emergency button has been actuated. In a further example, the door component that corresponds to the door component type can be designed as an authentication device. The authentication device verifies an authorization of the user to go through the door. If the user is authorized, the authentication device sends a corresponding signal to another door component, e.g. to a locking element or a door opener, which allows access.

Furthermore, the function of the door component type can contain properties of the door or can be adjusted to the property of the door. The properties of the door can correspond to functional properties of the door, e.g. sliding doors, swing leaf doors and revolving doors. The properties of the door can correspond to the design as a full leaf or as a tubular frame door. The properties of the door can correspond to the spatial dimensions and/or the weight of the door. For example, the power of the door drive can be adapted to the weight of the door.

Furthermore, the door component type can contain functional properties of the door component type itself. Examples of the functional properties can comprise e.g. “suitable for the escape route”, “for a fire protection door”, “self-locking”, “self-closing”.

The door component types preferably differ in that the door component types each reproduce a different function and/or a functional property to one another. Thus, for example, a “self-locking anti-panic lock with a motor for full leaf doors” can form a separate door component type. In another example, a “self-closing swing leaf door drive for use on normal doors up to 1100 mm wide or 160 kg in weight” can form another door component type.

Door component types preferably differ additionally or alternatively by the type and/or the arrangement of the electrical connection to at least one further door component. For example, the door component types can differ in terms of which interface is to be used to establish a connection to which other door component. Thus, the door component types e.g. differ by an assignment of connection terminals.

Additionally or alternatively, the door component types differ in the type of electronic integration into the door system type. For example, the door component types can differ in terms of whether a connection to at least one other door component takes place via a bus system, and possibly via which bus system. A connection to a bus system is understood below as a direct connection such that a component connected to the bus system is regarded as a participant of the bus system with its own bus address.

In order that the door component types differ in the type and/or arrangement of the electrical connection and/or the electronic integration, door component types from different manufacturers and/or different versions from the same manufacturer usually each form their own door component type.

According to the disclosure, a plurality of door component types are combined to form a door system type.

In the context of this disclosure, a door component type with at least one, preferably a plurality, of the mentioned distinguishing criteria is understood as a door component type, while the door component itself is understood as the device of the door component type that is actually installed on the door. A door system type comprises a plurality of door component types, while the door system itself comprises the door components to be specifically installed on the door.

One door system type may be designed to be installed on a door. It is conceivable that one door system type is designed for installation on a plurality of door leaves. For example, the door system type may be intended for installation on a double-leaf door. Additionally or alternatively, the door system type can be provided for installation on a plurality of doors, in particular doors arranged one behind the other. For example, an interlock can be formed in this way. Additionally or alternatively, the door system type may be designed for installing a plurality of doors along a corridor, e.g. a hotel corridor or an office corridor.

It is conceivable that a door system type comprises the same door component type multiple times, with several varieties of the same door component type having to be installed at different positions. For example, a door system type can have a “self-closing swing leaf door drive for use on normal doors up to 1100 mm wide or 160 kg in weight with a CAN bus connection” for a first door leaf of a double-leaf door and a “self-closing swing leaf door drive for use on normal doors up to up to 1100 mm wide or 160 kg in weight with a CAN bus connection” for a second door leaf of a double-leaf door. Additionally or alternatively, the same door component types can be provided for installation on a plurality of doors, in particular door arranged one behind the other.

It is conceivable that the door system comprises a first bus system. The first bus system can be designed e.g. as a CAN bus. It may be that a plurality of door components of the door system are connected to the first bus system. The first bus system is configured as a communication bus and/or is used to transmit messages.

According to the disclosure, the door system types are preconfigured. By making available preconfigured door system types with a plurality of door component types, it is possible in particular to prevent door components that do not match or are not suitable for the installation situation and/or the purpose of the door from being selected for installation, which together pose a security risk. Thus, the installation can be improved in terms of security by the method according to the disclosure.

An essential aspect is that preconfigured technical data of the selected door system type is made available to the installer. The installer can carry out the installation on basis of the preconfigured technical data. Since data preconfigured in each case for the different door system types and suitable for the respective door system type is available, the risk of the installation proceeding incorrectly and thus reducing the security of the installed door system can be reduced.

According to the disclosure, at least one door system type can be preselected by the configuration system by way of a user specification. The user specification can here comprise at least one technical user specification. A technical user specification can comprise a technical requirement for the door system type to be selected. Examples of a technical requirement are e.g. “with a motorized swing leaf door drive”, “with a motorized door drive for a weight class of a door”, “with a mortise lock”, “with an authentication device”, or more specifically “with a card reader”. Additionally or alternatively, the user specification can comprise a functional requirement for the door system type to be selected. For example, a functional requirement can comprise e.g. “barrier-free”, “for a fire protection door” or “for an escape route door”.

According to the disclosure, only those door system types that correspond to the user specification are made available to the user for selection. Within the meaning of the disclosure, user specifications therefore act as filters from which the user can select. This can ensure the safety of the door system for operation. It can thus be ensured in particular that a safety risk for people in the event of danger is reduced by only providing the suitable door system types and thus indirectly the suitable data for the door systems for selection. Additionally or alternatively, security can be ensured in that burglary or tamper protection is increased by only providing the suitable door system types and thus indirectly the correct suitable data for the door systems for selection.

The user specifications are preferably linked to the door system types in the database. At least one possible functional and/or technical user specification is thus permanently assigned to each door system type. The database can correspond to a first database. The configuration system can comprise the database. Alternatively, the database can be provided externally to the electronic configuration system.

The first database and/or a second database can comprise the technical data assigned to the door system type. In the first and/or second database, a door system type is in each case linked to the data assigned to the door system type.

It is preferably provided that the defined door component types of a door system are preconfigured, i.e. the data of the door component type can already comprise at least one predefined parameter, such as e.g. an opening speed.

A computing unit is preferably provided. The computing unit can comprise the configuration system. The computing unit can comprise the first database. The computing unit can comprise the second database. The computing unit can comprise at least one electronic memory for storing the first and/or second database. The computing unit can comprise at least one processor. The computing unit can comprise a display device in order to provide the user with the preselected door system types for selection. Alternatively, the computing unit can be connectable in terms of information technology to a display device in order to make the preselected door system types available to the user for selection. The computing unit can comprise an input device, e.g. a keyboard and/or a touch-sensitive screen, and/or be connected to an input device in terms of information technology so that the user can make the selection.

The computing unit can be designed e.g. as a cloud and/or as a cloud and a computing device connected to the cloud, e.g. a personal computer. The computing unit can be connected or connectable to a mobile terminal, e.g. a mobile telephone or a tablet. In this case, the computing unit and the mobile terminal can be connectable to one another, for example via a telecommunications connection and/or via the Internet.

The access system can comprise the computing unit and/or the mobile terminal. The access system can comprise the door system to be installed.

The method according to the disclosure is preferably a computer-implemented method. In the case of the computer-implemented method, the input of the user is necessary to record the technical and/or functional user specification.

In particular, it can be provided prior to step a. that a plurality of door system types are preconfigured by a user by a plurality of door component types having been stored so as to be assigned to each door system type and/or by data of the door system type having been created and having been stored so as to be assigned to the door system type. At least one technical and/or functional user specification has been stored in the database, in particular in the first database, so as to be assigned to the door system type.

In other words, a plurality of door component types are assigned to one door system type by the user. In addition, the user assigns at least one functional and/or technical user specification to the door system type. In particular, this assignment is stored in the first database. The door component types of the door system type are also stored in the first database. The user creates technical data for the door system type created in this way. The technical data is assigned to the respective door system type and is also stored in a database, in the first database and/or in the second database.

The method can thus be based on an electronically stored link between the technical and/or functional user specification and the door system type of the first database and/or an electronically stored link between the data and the door system type of a database, in particular the first or second database.

In particular, it can be provided that if the configuration system has not provided a suitable door system type for the selecting user in step a., a user specification that has already taken place is communicated electronically via the configuration system to a creating user, who has to create a new door system type. Additionally or alternatively, it can be provided that at least one similar door system type is suggested by the configuration system to the creating user on basis of the user specification in order to provide assistance when creating a new door system type. It is thereby expedient if the configuration system electronically requests the preconfiguration of a new door system type. For example, if it is determined by the configuration system that a specific motor lock, which forms its own door component type, is not arranged in any or any suitable door system types, a new door system type is requested.

In particular, it can be provided that a digital building plan is read into the electronic configuration system. In particular, prior to step a. the digital building plan can be read into the electronic configuration system. The digital building plan can be a two-dimensional building plan or a three-dimensional computer model.

It may be that when a door system type is selected for an installation location, the door system to be installed is provided with an identifier, in particular a unique identifier.

It is conceivable that after the door system type has been selected by the user in step a. the preconfigured, selected door system type is placed, in particular inserted or linked, in the digital building plan at the provided installation location. Additionally or alternatively, the door system to be installed can be provided with the identifier that is assigned to the installation location. In particular, the identifier can be placed, in particular inserted or linked, on the digital building plan.

In particular, it may be that an assignment of a door system type and/or the identifier at an installation location is stored in the building plan and the original assignment is archived when the door system type and/or the identifier at the installation location changes.

It is conceivable that the digital building plan can be divided by the user in the configuration system into a plurality of security regions that are in particular visible. The security regions can, for example, thereby comprise regions with the same access requirements. The security regions can, for example, thereby comprise regions with the same hazard security requirements. For example, the security regions can be marked in color.

In particular, it can be provided that on the basis of the security region, the provision in step a. is reduced to door system types suitable for the security region. Alternatively or additionally, in step a. the user specification can comprise the security region. It is conceivable that the configuration system issues a warning when a door system type that is not suitable for the security region is selected.

It may be preferred that, if the user input comprises the use of a hazardous situation, in step a. only the at least one door system type is made available for selection, which fulfills a specification for the hazardous situation at the installation location, which serves to protect human life. In this way, standardized installation specifications are also advantageously taken into account. The use for a hazardous situation can e.g. correspond to the use of an escape route and/or fire protection.

It may preferably be provided that after step a., the selected door system types are assigned to different installation locations. It is conceivable that the configuration system electronically verifies whether the selected door system types are consistent with the installation location and/or are consistent with door system types that are on a walkable route on the building plan.

If, for example, two escape route types are selected in a corridor, but the third escape route type is not an escape route door, the inconsistency is displayed so that it can be corrected at an early stage. For example, if access authorization devices are selected on all exterior doors but not on one, the inconsistency will be displayed so that it can be corrected at an early stage. For example, if all corridors in the hospital through which beds are pushed have a door drive, but only one door does not, the inconsistency will be displayed so that it can be corrected at an early stage. For this purpose, different routes and/or security regions can be marked in the configuration system on the digital building plan.

It can preferably be provided that the same door system type is automatically provided by the configuration system for other doors of a spatial region, e.g. a security region, in step a. In particular, it can be provided that the type of provision indicates to the selecting user that the door system type has already been used. It is expedient here that the configuration system stores door system types that have already been used once. Storage as "used once" can refer to a digital building plan, a digital building plan group, a building and/or a user, for example. In particular, the configuration system suggests the door system types that have already been used once again as preferred. This can be used to create a favorites bar, for example. Additionally or alternatively, it can be provided that the door system types already used are marked. These measures are advantageous with regard to a less error-prone installation.

It is conceivable that a reduced number of door system types is available for a user or a user group to be preselected by the configuration system. In particular, subgroups of door system types can be configurable for individual users, user groups, digital building plans, digital building plan groups and/or buildings. These measures are also advantageous with regard to a less error-prone installation.

It can preferably be provided that the electronic configuration system comprises a plurality of authorization levels, with each user being assigned to an authorization level, with at least two, preferably all, of the following authorization levels being provided:

- a first authorization level that allows a new door system type to be created,
- a second authorization level that allows a preconfigured door system type to be selected and/or user specifications to be set,
- a third authorization level that allows data of the selected door system type to be retrieved or viewed.

It is preferably forbidden for users of the second authorization level to create a new door system type. It is preferably forbidden for users of the third authorization level to select a door system type or to set user specifications. It is preferably forbidden for users of the third authorization level to create a new door system type.

It is preferably allowed for users of the first authorization level to select a preconfigured door system type and/or to set user specifications. It is preferably allowed for users of the first authorization level to retrieve the technical data of the selected door system type. It is preferably allowed for users of the second authorization level to retrieve the technical data of the selected door system type. Viewing can be understood, for example, as opening a file on the computing unit. Retrieval can be understood, for example, as a download or requesting a delivery. This means that the user of the first authorization level has more rights than the user of the second authorization level. A user of the third authorization level has fewer rights than a user of the first and/or second authorization level.

It is conceivable that only the first and the second authorization level are provided in the configuration system. This is in particular conceivable if the user who makes the selection from the door system types also carries out the installation on site. Alternatively, only the second and the third authorization levels can be provided in the configuration system. This is in particular conceivable if no new door system types are to be created. It is conceivable that only the first and the third authorization level are provided in the configuration system. This is in particular conceivable if the selection of the door system types is often accompanied by the creation of a new door system type. In a particularly preferred variant, the configuration system comprises the first, the second and the third authorization level.

The security of the installation can be guaranteed through the tiered permissions of individual users. For example, it takes outstanding expertise to create a new door system type. It takes a high level of expertise to choose the right door system type for individual installation locations. By making the data available for the door system type, however, it is preferably not necessary for outstanding or a high level of expertise to be available on site during installation. Rather, general installation knowledge from other areas is preferably sufficient to install the door system on site. The user of the third authorization level is in particular the on-site installer.

Preferably, the plurality of door system types preconfigured by a user and stored prior to step a. have been stored by a user of the first authorization level. It is also conceivable that a creating user, who has to create a new door system type and to whom a user specification that has already been made is communicated electronically via the configuration system and/or on the basis of the user specification at least one similar door system type is suggested by the configuration system, is a user of the first authorization level.

It is conceivable that the authorization levels are defined in the electronic configuration system. It may be that the authorization levels are linked to a user, in particular an authentication of the user. For example, a user must input a username and/or a password or authenticate themselves through a biometric feature in order to work with the configuration system. In the configuration system, the username, the password and/or the biometric feature is linked to the authorization level.

In particular, it can be provided that, in particular in the third authorization level, detailed information in a database, in particular in a third database, can be added to the selected door system type or the door system to be installed. For example, spatial dimensions of the door component to be installed, e.g. a backset of a mortise lock, can be added to the door system to be installed. For example, the door system to be installed can be retrieved using the identifier and detailed information can be added.

For example, the data for the selected door system type can be transferred from the second database to a third database. In the third database, the data of the selected door system type for a provided installation location is supplemented with data of the door system to be installed specifically at the installation location. It is conceivable that the computing unit comprises the third database.

The detailed information preferably comprises at least one spatial dimension. In contrast, the detailed information can preferably be free of the type and/or the arrangement of the electrical connection and/or the electronic integration of the door components, the function of the door components and/or the functional properties of the door components. The type and/or the arrangement of the electrical connection and/or the electronic integration of the door components, the function of the door components and/or the functional properties of the door components are preferably inherent properties of the selected door system type.

It can preferably be provided that the preconfigured technical data that is made available in step b. is stored in a database, in particular in the second database, linked to the door system type.

It is conceivable that the preconfigured data relates to a plurality of, in particular all, door components of the door system.

It may be that the preconfigured data can be downloaded from a database, in particular the second database and/or the third database, upon an input of a user.

To make the technical data from step b. available, it may be that an input of the user, in particular the installer, contains the door system type or information that is linked to the door system type, in particular an installation location or the identifier of the door system.

These measures are expedient for a user of the third authorization level. The database is in particular the second database in which the technical data and a link to a door system type is stored. Alternatively, it can be the third database, in which the technical data of the door system type is supplemented with further data of the door system to be installed.

It can preferably be provided that the preconfigured data comprises a circuit diagram of the door system.

It is conceivable that the circuit diagram can be downloaded or viewed from the configuration system and/or from a database onto a mobile terminal. The database can in particular be the second and/or the third database. The mobile terminal can be a mobile telephone or a tablet.

In order to view or retrieve, in particular to download, the circuit diagram, it can be provided that the installation location on the digital building plan, the door system type and/or the identifier of the door system is input into the mobile terminal.

The method preferably comprises the spatial arrangement of the door components at the provided positions. This is preferably carried out by the installer.

The method preferably comprises electrically connecting the door components according to the circuit diagram. This is preferably carried out by the installer.

It can preferably be provided that the data comprises an electronic configuration of the door system. The electronic configuration can be designed as at least one electronic file, in particular a template.

It may be that the electronic configuration comprises at least one, preferably a plurality of, particularly preferably all, of the following electronic information:

- provided door component types of the door system
- transmitters and/or receivers of messages within the door system
- at least one functional process of the door system, in which a plurality of processes are to be carried out in a specified order
- parameters for operating the door system
- a test process for the door system, in which at least one function or a functional process of the door system is tested for commissioning.

For example, door components of the door system can be connected to one another in terms of information technology. In particular, door components of the door system can be connected to one another via a bus system, in particular via a first bus system. The first bus system can be a CAN bus, for example. The electronic configuration can comprise which door component type or which door component type at which position sends a message, in particular a command or information, e.g. status information, to which other door component type or to which door component type at which position.

It may be that a time-coordinated functional process of the door system can be provided in the door system. For example, authentication can be carried out first, in order to then allow access for the user. For this purpose, a locking element or a door opener can be actuated after successful authentication. In another example, the door is first unlocked in order to then open the door by motor. Another example is the motorized opening of an active leaf door in front of a passive leaf door or the time-adjusted opening of the doors of an interlock. It is conceivable that the electronic configuration comprises a computer program product or instructions for executing a computer program product, by means of which the functional process can be controlled.

The electronic configuration can comprise parameters for the operation of the door system. In particular, the parameters for operating the door system can comprise parameters for the individual door components. Examples of parameters may comprise an opening and/or closing speed of a door drive, a hold-open time of the door drive, an unlocking time of a locking element, a monitoring time before an alarm is output.

It is preferably provided that the electronic configuration comprises a test process for the door system or instructions for carrying out the test process. In particular, the at least one functional process is tested during installation. The method according to the disclosure can thus comprise carrying out the test process.

The door system may comprise a control unit as a door component. The control unit is connected in terms of information technology in particular to other door components. The control unit and the other door component can thus exchange messages. The control unit is connected in terms of information technology in particular to the computing unit. The control unit can be connected to the first bus system. The control unit can be connected to a second bus system. In particular, the second bus system is an IP-enabled bus, such as e.g. LON, LAN or the Ethernet. In particular, the computing unit and the control unit are connected to one another via the second bus system.

The control unit can comprise a transmitting and receiving unit for wireless near-field communication, in particular Bluetooth Low Energy, with the mobile terminal.

In particular, the electronic configuration can be loaded into the door system, in particular into the control unit, via an information technology connection, e.g. a bus system, in particular the second bus system, or via the mobile terminal.

It can preferably be provided that the electronic configuration of the door system is stored in the control unit.

It is conceivable that the door system comprises at least one door component, preferably a plurality of door components, with the at least one door component belonging to at least one door component group, preferably to a plurality of the following door component groups:

- motorized door drive
- locking element,
- signal transmitter for opening, stopping, closing, locking or unlocking a door, in particular a sensor, an authentication device or a hazard detector,
- detection unit for receiving an access attribute The motorized door drive can in particular be a sliding door drive, swing leaf door drive and/or revolving door drive. The locking element can in particular be an element with which a door can be electrically locked and/or unlocked. Examples are e.g. a drive lock, a motor lock, an electromagnetic door lock.

The door system may comprise a device to enable manual unlocking of the door. For example, the door system can comprise a door opener, an electromechanical lock cylinder or an electromechanical fitting.

The door system can comprise a signal transmitter, in particular a sensor, an authentication device, an escape route controller or a hazard detector. The signal transmitter preferably generates a message, in particular a bus telegram, as a signal. The signal transmitter is preferably connected to a bus system, in particular to the first bus system.

The door system can be designed to receive an access attribute of an authorized user. For this purpose, the door system can comprise a detection unit. The detection unit can be designed as a transmitting and receiving unit, as a biometric sensor, as a keypad for inputting a PIN and/or as a contact element for making electrical contact with an in particular electronic key. The access attribute can be designed as a credential or a biometric feature of the user. The credential can comprise e.g. an access code and/or a time window for access authorization. It may be that the door system is designed, for example, as a reader with a transmitting and receiving unit for wirelessly receiving an access attribute, in particular credentials. The transmitting and receiving unit can be designed to communicate with a mobile terminal, in particular a mobile telephone or a card, by near-field communication, in particular RFID, NFC or Bluetooth Low Energy.

It is preferably provided that door components from the group of door drives, locking elements and signal transmitters are connected to one another in terms of information technology, preferably via a bus system, particularly preferably via the first bus system.

It is preferably provided that door components from the group of detection units are connected to one another in terms of information technology, preferably via a bus system.

It may be that the door system comprises a further bus system. The further bus system, e.g. an RS485 bus, can be used to connect at least one detection unit to the control unit and/or to connect a plurality of detection units to one another. Alternatively, a serial interface, e.g. RS232, can be used to connect a door component, in particular a detection unit, to the control unit.

It may be that a plurality of functions are implemented in the same door component. For example, an electromechanical fitting can comprise a coupling element that allows manual unlocking of the door in an engaged state. At the same time, the electromechanical fitting comprises a detection unit, in particular a transmitting and receiving unit for wirelessly receiving a credential. In addition, the electromechanical fitting can comprise a processor and a memory, with which the credential is evaluated and a decision is made regarding access. Thus, the electromechanical fitting acts as an authentication device.

It may be that a plurality of door components are connected to the first bus system. For example, at least one door drive and at least one locking element can be connected to the first bus system. In addition, the control unit can be connected to the first bus system.

In particular, the door system can comprise escape route security system with an emergency button and a door lock.

It can be preferred that the access system, preferably the door system, particularly preferably the control unit and/or the mobile terminal, has knowledge of door components actually installed in the door system and compares them with the provided door component types of the door system type in the electronic configuration, and if the installed door components deviate from the provided door component types, it is predefined in an electronically stored manner how the installation process is to be continued. In this case, the control unit can at least have knowledge of the door components installed in the door system, which are connected to the control unit in terms of information technology, in particular via a bus system.

In particular, it is electronically detected if a higher-quality component than provided is installed. In such a case, the installation method can continue.

The installation method can be continued additionally or alternatively if tolerable deviations are recognized by the access system, in particular the control device and/or the mobile terminal. Tolerable deviations can be spatial dimensions, for example.

In particular, it can be provided that the predefinition of how to proceed with the installation method corresponds to one of the following options, depending on the type of deviation:

- the start-up of an operation of the door system is electronically prevented,
- the start-up of an operation of the door system takes place with a limited range of door components,
- the start-up of an operation of the door system takes place as intended.

In particular, the user is automatically informed of the deviation. It is conceivable that the predefined continuation is suggested to the user. In an alternative, the predefined continuation is carried out automatically.

It is particularly preferably provided that a deviation of the installed door components from the provided door component types of the selected door system type always or at least predominantly leads to a discontinuation of the installation method with the selected door system type and/or the electronic configuration used. Such a discontinuation is provided in particular if the deviation in the type and/or arrangement of the electrical connection and/or the electronic integration of the door components includes the function of the door components and/or the functional properties of the door components.

It can preferably be provided that the start-up of an operation of the door system is electronically prevented in the event of a defined deviation. Such a prevention occurs in particular when the type and/or the arrangement of the electrical connection and/or the electronic integration of the door components, the function of the door components and/or the functional properties of the door components do not correspond to the provided door component types.

It is conceivable that the installed door components will be installed as part of the alternative door system type with the electronic configuration of an alternative door system type.

If the defined deviation is present, in particular the use of an alternative door system type that corresponds to the actually installed door component types is checked in the configuration system.

In particular, it can be provided that the alternative door system type is suggested for selection by the user, in particular to a user of the first or second authorization level, before the installation with the electronic configuration of the alternative door system type is installed. This allows the user to see and correct inconsistencies.

It may be preferred if the control unit has knowledge of the door component types actually installed in the door system, in that the door components register with the control unit, specifying the door component type. It may be that the registration takes place via the first bus system.

In particular, it can be provided that the door system comprises an adapter, with the adapter being designed to communicate with the other door components for a door component that cannot independently communicate with the other door components, in particular with the adapter being connected to the bus system.

It can preferably be provided that an identifier of the installed door component is stored in the access system, in particular in the computing unit, together with at least one further feature of the component, in particular the door component type. The storage can, for example, take place prior to step a. The storage can take place in a database, in particular in the third database. The storage can take place, for example, as part of the manufacture of the door component. The additional feature can comprise information about the production location and/or the production time, for example. The identifier may be a one-time use identifier. The identifier can be an identifier used once in the third database.

It is conceivable that at the end of the installation the identifier of installed door components is associated with an identifier of the door system and/or the installation location and is stored in the computing unit. In particular, the identifier can be stored in the computing unit, with a production location and date also being able to be stored as a further feature. This makes it possible to trace which door component has been installed where. The assignment takes place at least for those door components that are connected to the control device in terms of information technology, in particular via a bus system. The assignment takes place particularly preferably for all door components of the door system.

In a further aspect of the disclosure, a computer program product for carrying out the method is presented. The advantages mentioned above in relation to the corresponding configuration of the method are correspondingly associated with the computer program product. In particular, the correspondingly designed computer program product can be used to carry out the method. The computer program can comprise commands for carrying out the method according to the disclosure. The computer program product can comprise the configuration system. The computer program product can be stored in an executable manner on the computing unit. Another computer program product for carrying out a preferred method can be stored in an executable manner in the door system, in particular in the control unit. The computer program product stored on the control unit can comprise commands for carrying out an advantageous method, in particular a method according to one of claims 10 to 12.

In a further aspect of the disclosure, an access system for carrying out the method is indicated. The advantages mentioned above in relation to the corresponding configuration of the method are correspondingly associated with the access system. In particular, the correspondingly designed access system can be used to carry out the method.

BRIEF DESCRIPTION OF THE DRAWINGS

Further details and advantages of the disclosure will be explained below on the basis of the exemplary embodiments shown in the figures. Technical features with identical functions are provided here with identical reference numerals in the figures. They show.

DETAILED DESCRIPTION OF THE DRAWINGS

Figure 1:
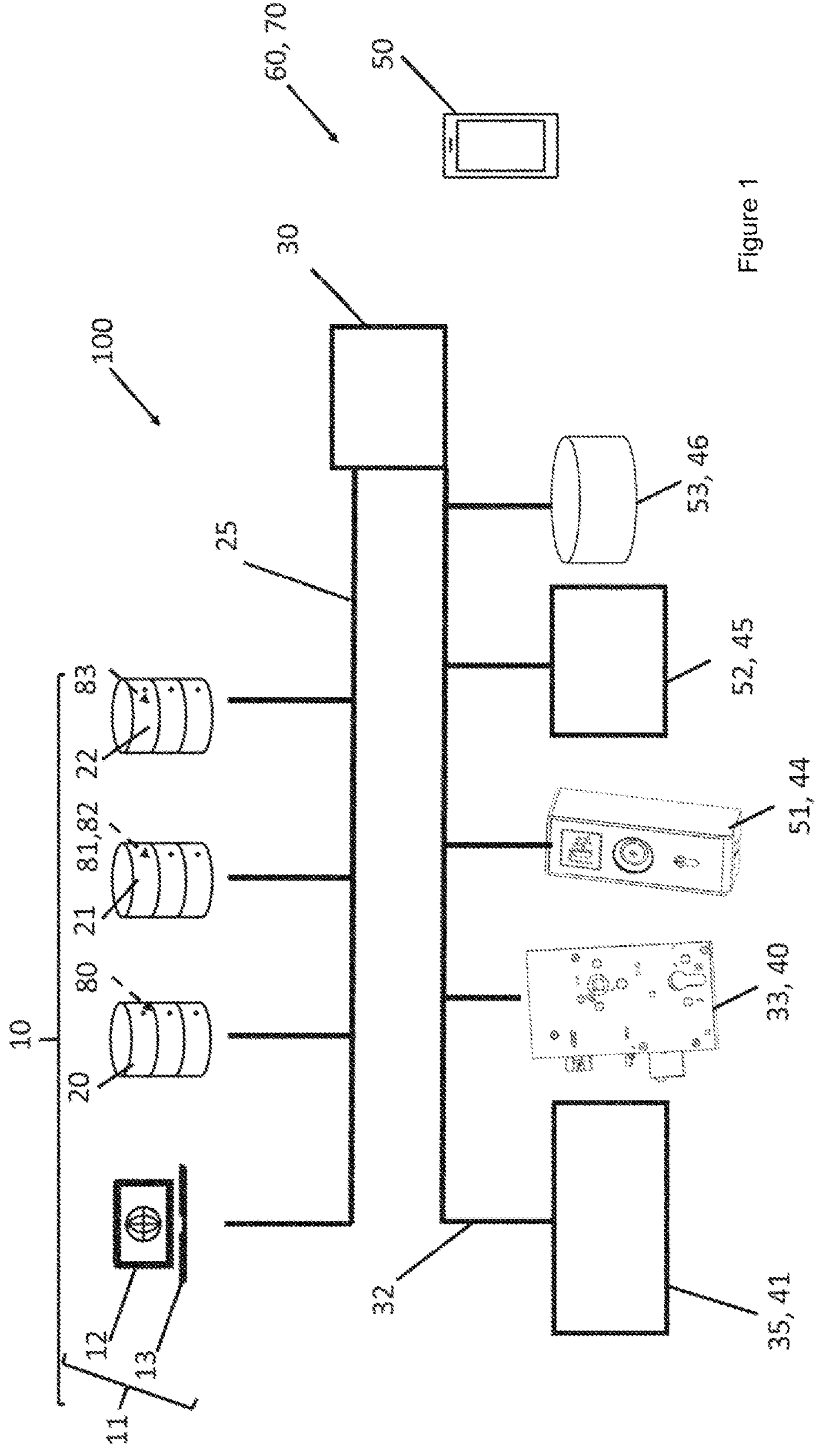
FIG. 1 a first exemplary embodiment of a computing unit according to the disclosure and an access system according to the disclosure, FIG. 2 a second exemplary embodiment of a computing unit according to the disclosure and an access system according to the disclosure, and FIG. 3 a basic flow chart of the method according to the disclosure.
Figure 2:
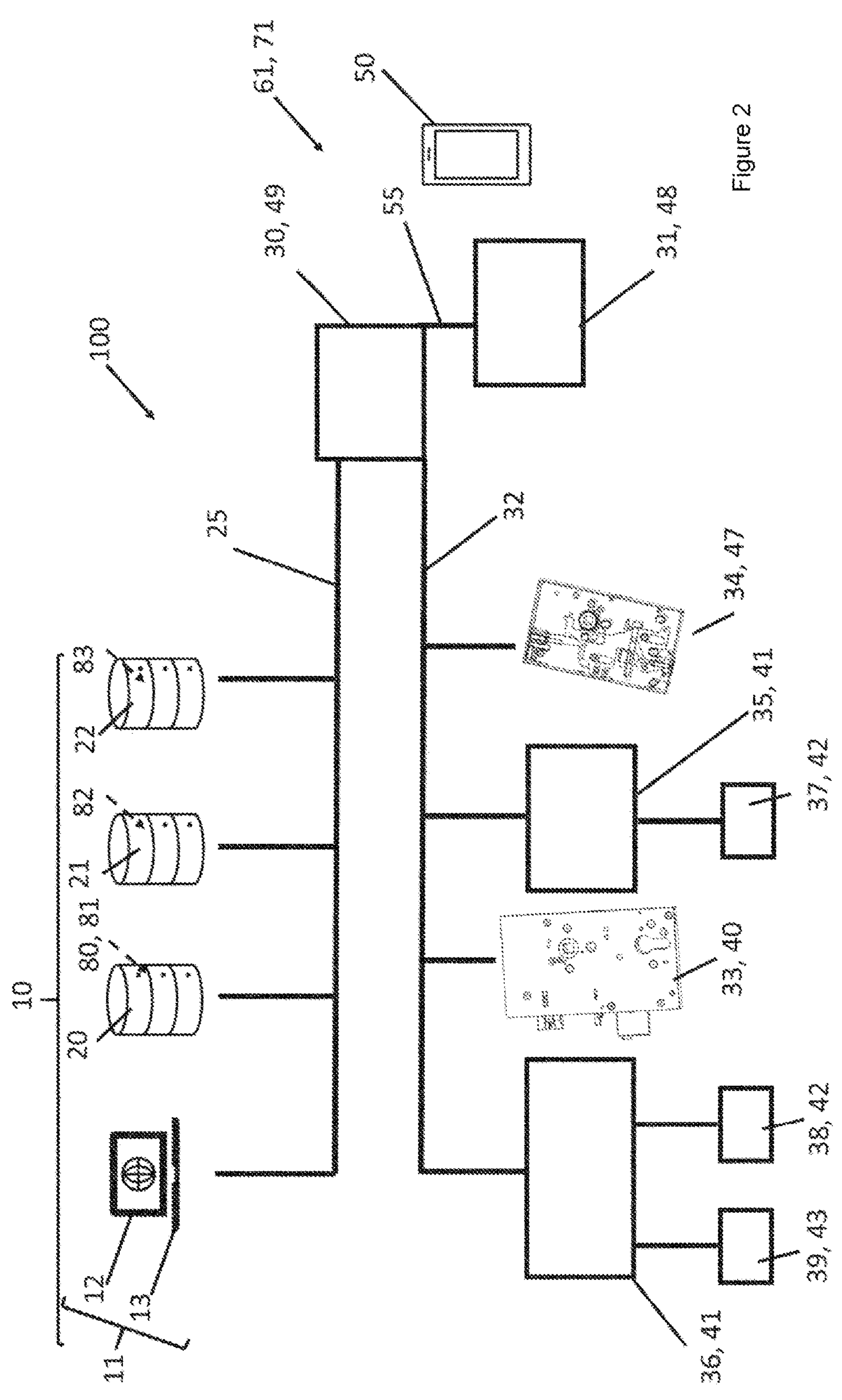

A first exemplary embodiment and a second exemplary embodiment of an access system 100 according to the disclosure are represented in FIGS. 1 and 2. The access system 100 according to the disclosure comprises a computing unit 10 according to the disclosure. The computing unit 10 comprises a computing device 11 which is designed as a personal computer. The computing device 11 comprises a display device 12, which is designed as a screen. The computing device 11 comprises an input device 13, which is designed as a keyboard. Alternatively and not represented, the computing device can be designed as a tablet, for example. The input device 13 can be designed as a touch-sensitive screen.

The computing unit 10 also comprises at least one electronic memory. For example, this can be a memory in a cloud. A first database 20, a second database 21 and a third database 22 are stored in the memory. Alternatively and not represented, the first and the second database 20, 21 can be designed as a common database. The second and the third database 21, 22 can also be designed as a common database. In a further alternative, the first and the third database 20, 22 can be designed as a common database. In a further database, the first to third databases 20, 21, 22 are integrated in a common database.

The configuration system is stored electronically in an electronic memory of the computing unit 10. The configuration system is designed as a computer program product. The configuration system comprises the databases 20, 21, 22.

At the start of the installation method according to the disclosure, the other devices represented in FIGS. 1 and 2 have not yet been installed. Rather, the access system 100 according to the disclosure is represented in FIGS. 1 and 2 at a possible end of the installation method 200 according to the disclosure.

Different door systems 60, 61 are represented in FIGS. 1 and 2. The door systems are part of the access system 100. The door systems 60, 61 each comprise a control unit 30 as a first door component. The door systems 60, 61 each comprise a first bus system 32.

The door systems 60, 61 comprise other door components. The first door system 60 in FIG. 1 comprises, for example, a motorized door drive 35, a motor lock 33, an escape route controller 51 with an emergency button, an electromagnetic door lock 52 and a hazard detector, in particular a smoke detector 53, as additional door components. The door components 35, 33, 51, 52, 53 have different functions and functional properties. Thus, the door components 33, 35, 51, 52, 53 belong to different door component types 40, 41, 44, 45, 46.

The second door system 61 in FIG. 2 comprises a plurality of motorized door drives 35, 36 as door components. The motorized door drives 35, 36 are of identical design and thus belong to the same door component types 41. The door drives 35, 36 are designed to each be arranged on a door leaf of a double-leaf door. Furthermore, the second door system 61 comprises a plurality of sensors 37, 38 as door components. The sensors 37, 38 are used to detect a person approaching the door leaves. The motorized door drives 35, 36 can then open the door leaves in an order predefined in time as a functional process. Additionally or alternatively, the signals of the sensors 37, 38 are used to stop the door by means of the door drive 35, 36 in order to avoid injury to the person. The sensors 37, 38 are of identical design and thus belong to the same door component types 42.

Furthermore, a program switch 39 is provided as a door component. A user can use the program switch 39 to determine whether or not the sensors 37, 38 cause a motorized door opening when a person is detected. The second door system 61 comprises a motor lock 34 for an active leaf of the double-leaf door and a motor lock 33 for a passive leaf of the double-leaf door. The program switch 39 and the motor locks 33, 34 are each assigned to their own door component types 40, 43, 47. Another door component of the second door system 61 is designed as a reader 31. An access decision is made by the control unit 30. Thus, the control unit 30 also serves as an authentication device.

The door components 33, 35, 51, 52, 53 of the first door system 60 are connected to a first bus system 32. Some door components 33, 34, 35, 36 of the second door system 61 are connected to the first bus system 32. Other door components 37, 38, 39 of the second door system 61 are only indirectly connected to the control unit 30 via a door drive 35, 36. The reader 31 is connected to the control unit 30 via a third bus system 55. The control unit 30 comprises a transmitting and receiving unit for wireless near-field communication with a mobile terminal 50. The mobile terminal 50 can be connectable to the computing unit 10 in terms of information technology, e.g. via a telecommunications network or via the Internet.

In another door system type, not represented, a plurality of readers 31 can be provided on the third bus system 55. The sensors 37, 38 or the program switch 39 can also be connected to the first bus system 32.

Since the first door system 60 and the second door system 61 comprise different door components, the first door system 60 and the second door system 61 correspond to different door system types 70, 71.

According to the disclosure, it is provided that different door system types 70, 71 are stored in the first database 20. The door system types 70, 71 are preconfigured according to the disclosure. As a result, the door components 33, 34, 35, 36, 37, 38, 39, 51, 52, 53, which are to be installed when the door system type 70, 71 is selected, are permanently predefined.

Technical and/or functional user specifications that are linked to the individual door system types 70, 71 are stored in the first database 20. This link is designated by reference numeral 80 in FIGS. 1 and 2. Possible user specifications are displayed to a user on the display device 12. The user can select user specifications to be fulfilled for the door to be equipped with the door system 60, 61. The configuration system shows the user only those door system types 70, 71 that correspond to the user specifications. The configuration system thus preselects the door system types 70, 71. The user can select a door system type 70, 71 from the preselected door system types. The selection can also mean that only one possible door system type 70, 71 is made available for selection. The selection is confirmed by the user.

The computing unit 10 then provides a user, in particular an installer, with technical data 81, 82 in the form of a circuit diagram 81 and of an electronic configuration 82. The technical data 81, 82 is linked to the door system type 70, 71. The technical data 81, 82 is stored in a second database 21 in FIG. 1. In FIG. 2, the circuit diagram 81 is stored in the first database 20 and the electronic configuration 82 in the second database 21. The installation is carried out on site by means of the technical data 81, 82.

Since fixedly predefined and preconfigured door system types 70, 71 are used, to which fixedly predefined user specifications and fixedly predefined technical data 81, 82 are assigned, the security of the access system 100 according to the disclosure is very high. This avoids installing door components 33, 34, 35, 36, 37, 38, 39, 51, 52, 53 that do not meet the security requirements and/or incorrectly installing the door components 33, 34, 35, 36, 37, 38, 39, 51, 52, 53.

The configuration program can only be accessed by a user after authentication, e.g. after inputting a username and a password. An authorization level is linked to each user in the configuration program. Only users of a first authorization level may configure new door system types 70, 71, link the new door system types with user specifications and create the technical data. Only users of the first and second authorization level may set user specifications and select a stored door system type. Users of a third authorization level, which corresponds to the installer who carries out the installation on site, are only allowed to download the technical data for a door system type that has already been selected. Usually only a very small number of users will be users of the first authorization level, since the users of the first authorization level require a very high technical qualification. This ensures the security of the access system.

A door system 60, 61 is preferably characterized in that each door system 60, 61 comprises a common electronic configuration. The configuration 82 is designed as at least one electronic file and can be stored on the control unit 30. Exactly one configuration is preferably provided for each door system type 70, 71.

A door system 60, 61 preferably comprises a common control unit 30. The control unit is used to connect to the computing unit 10.

Depending on the door system type 70, 71, a door system 60, 61 can be provided for arrangement on one or on a plurality of doors. In a further exemplary embodiment, not represented, a door system is used, for example, to be arranged on two doors arranged one behind the other or in a hotel corridor with, for example, four room doors.

It may be that an access system 100 comprises a plurality of door systems 60, 61. The door systems 60, 61 can belong to the same or different door system types 70, 71. The door systems 60, 61 are preferably connected to one another and/or to the computing unit 10 via the second bus system 25.

Figure 3:
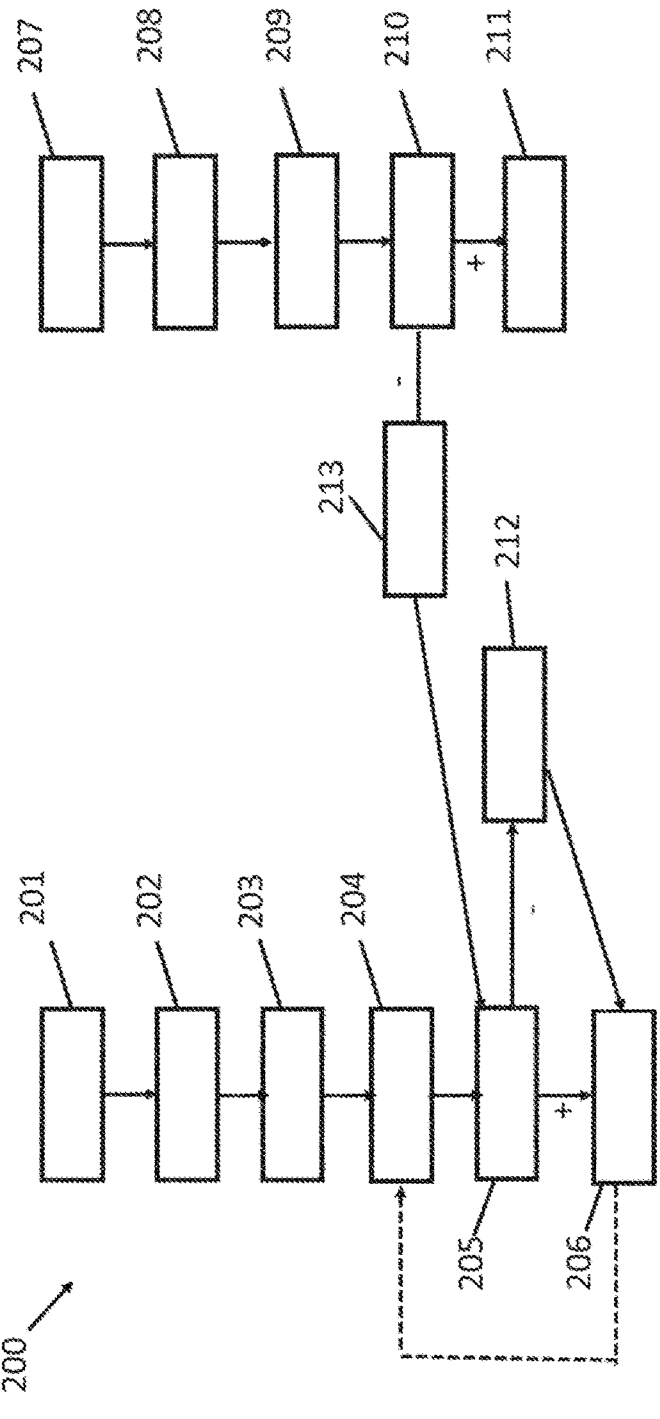

A method 200 according to the disclosure is schematically represented in FIG. 3. In a first step 201, a user of the second authorization level authenticates themselves in the configuration system. In a second step 202, a digital building plan is loaded into the configuration system by the authenticated user. The digital building plan is stored in the third database 22. The third database 22 serves to store at least data from a building section or a building.

In a third step 203, the authenticated user defines at least one security region on the digital building plan via the input device 13, with the security region being stored in the configuration system, in particular in the third database 22. In a fourth step 204, the authenticated user selects a door on the building plan, in particular a door in the security region, by means of the input device 13 and makes technical and/or functional user specifications for the selected door via the input device 13. For this purpose, the configuration system makes user input options available on the display device 12. In a first example, the user specifications comprise the terms “escape route door” and “single leaf”. In a second example, the user specifications comprise the terms “double-leaf”, “with motor lock”, “with swing leaf door drive”.

In a fifth step 205, the configuration system uses door system types 70, 71 suitable on the basis of the user specifications and makes them available to the user for selection. In the first example, the door system type 70 from FIG. 1 is provided for selection, but not the door system type 71 from FIG. 2. In the second example, the door system type 71 from FIG. 2 is provided for selection, but not the door system type 70 from FIG. 1. Step 205 corresponds to step a.

If an “escape route door” or a “fire protection door” is requested as a user specification in step 204, then in step 205 only the at least one door system type 70, 71 is made available for selection, which fulfills a specification for the hazardous situation at the installation location, which serves to protect human life.

If the user can decide on the preselected door system type 70 or 71 or on one of the preselected door system types, which is represented in FIG. 3 with a “+”, then the method continues with the next step 206. If, on the other hand, the user cannot decide on a preselected door system type 70 or 71 or if there is no door system type 70, 71 in the first database 21 that corresponds to the user specifications, which is represented in FIG. 3 with a “–”, then in step 212 the user of the second authorization level can request the creation of a new door system type 70, 71. The configuration system communicates the user specifications to the user of the first authorization level. If the new door system type 70, 71 has been created by the user of the first authorization level and the user of the second authorization level can decide on this, the method 200 is also continued with step 206.

In step 206, the selected door system type 70, 71 is assigned, in particular linked, to the door on the digital building plan. Furthermore, an identifier for the door system 60, 61 is generated by the configuration system, e.g. “door system 325”. The selected door system type, the placement on the digital building plan and the identifier of the door system 60, 61 are stored electronically in the third database 22 in the configuration system. This building information is represented in FIGS. 1 and 2 with reference numeral 83. The technical data 81, 82 for the door system 60, 61 to be installed is optionally stored in the third database 22.

Optionally, the authenticated user can now select another door on the digital building plan and steps 204 to 206 are repeated for the other door. This is represented with broken lines in FIG. 3. Here, the already selected door system type, i.e. either door system type 70 or 71, is displayed to the user as the preferred option. This applies in particular to a door in the same security region. Optionally, the configuration system verifies in the case of the selected door system types 70, 71 for the other doors whether the door system types are consistent with the installation location or with each other. For this purpose, for example, a route can be specified on the building plan. If a door system type 70, 71 on the route differs from the other door system types 70, 71 on the route, the configuration system sends a request to the user.

At the construction site, an installer authenticates themselves as a user of the third authorization level in the configuration system in a step 207. In a step 208, the installer downloads a circuit diagram 81 for the door system 60, 61 to be installed from the third database 22 as technical data. This corresponds to step b.

For this purpose, the installer carries a mobile terminal 50 with them (see FIGS. 1 and 2). In a first option, the installer inputs the identifier of the door system 60, 61 into the mobile terminal 50. In a second alternative, the installer specifies the installation location in the mobile terminal 50. For this purpose, the digital building plan 81 is displayed on the mobile terminal. In a third alternative, the installer inputs the door system type 70, 71 to be installed into the mobile terminal 50. In each of the alternatives, the door system type 70, 71 is now known to the configuration system.

The circuit diagram 81 of the door system type 70, 71 is then loaded onto the mobile terminal 50 from the first, second or third database 20, 21, 22 of the configuration system. The installer can use the circuit diagram 81 to carry out the installation.

In a next step 209, an electronic configuration of the door system type 70, 71 specified in step 208 is loaded into the control unit 30 from the second or the third database 21, 22 of the configuration system. This also corresponds to step b. In this case, either the mobile terminal 50 can connect the control unit 30 to the computing unit 10 or the control unit 30 has been connected to the computing unit 10 via a second bus system 25. The installer can download the electronic configuration 82 into the control unit 30 by way of an input on the mobile terminal 50.

The electronic configuration 82 comprises a list of the door component types 40, 41, 42, 43, 44, 45, 46, 47, 48, 49 and the number of door components to be installed for the respective door component types 40, 41, 42, 43, 44, 45, 46, 47, 48, 49. In a step 210, the control unit 30 automatically receives a message via the first bus system 32 regarding the door component types 40, 41, 44, 45, 46, 47 of the other door components 33, 34, 35, 36, 51, 52, 53 connected to the first bus system 32. To do this, the door components 33, 34, 35, 36, 51, 52, 53 as bus participants send a message to the control unit 30. The door components 35, 36 participating in the first bus system 32 report the door component types 42, 43 of the other door components 37, 38, 39 to the control unit 30. For this purpose, the door components 35, 36 have previously verified whether the door components 37, 38, 39 are connected. In a further alternative, the control unit 30 sends a request to the mobile terminal 50 so that the installer confirms the presence of the door components 37, 38, 39 via an input on the mobile terminal 50 or performs an action that allows the door components 35, 36 to determine the presence of the door components 37, 38, 39.

The control unit 30 also receives a message via the third bus system 55 via the connected reader or readers 31. The control unit 30 compares the installed door component types 40, 41, 42, 43, 44, 45, 46, 47, 38, 49 with the list.

In an alternative to step 210, the electronic configuration 82 comprises only a list of the door component types 40, 41, 44, 45, 46, 47, 48, 49 and the number of door components of the door component types to be installed which are determined to participate in the first and/or in the third bus system 32, 55. The control unit 30 automatically receives a message via first bus system 32 regarding the door component types 40, 41, 44, 45, 46, 47, 48 of other door components 33, 34, 35, 36, 51, 52, 53 connected to first bus system 32. To do this, the door components 33, 34, 35, 36, 51, 52, 53 as bus participants send a message to the control unit 30. The control unit 30 also receives a message via the third bus system 55 via the connected reader or readers 31. There is no message from the door components 35, 36 to the control unit 30 regarding the other door components 37, 38, 39. Only the door component types of the door components 33, 34, 35, 36, 51, 52, 53 participating in the first and/or third bus system 32, 55 are detected by the control unit 30.

In a first alternative, the control unit 30 compares the door components with the list. In a second alternative that is not represented, the reported door components 31, 33, 34, 35, 36, 51, 52, 53 and the list of components are transmitted to the mobile terminal 50, with the mobile terminal 50 comparing the reported door components 31, 33, 34, 35, 36, 51, 52, 53 with list of components.

If the comparison of the list with the door component types of the actually installed door components shows that the correct door component types are present, which is represented by a "+" in FIG. 3, the installation method is continued in step 211. If, on the other hand, the comparison shows that the installed door component types do not match the list, which is shown with a "−" in FIG. 3, the installation method is continued in step 213. In step 213, the user of the third authorization level is informed on the mobile terminal 50, in particular by the control unit 30, that the installed door component types are not suitable for the door system type 70, 71. This interrupts the installation on site and the control unit 30 does not proceed with the installation method.

At the same time, the user of the second authorization level is sent a message that the door component types on the door system 60, 61 with the allocated identifier are not suitable for the door system type 70, 71. Optionally, the user of the second authorization level is provided with a suggestion for a suitable door system type 70, 71 by the configuration system. This in turn corresponds to step a. or 205, since the user specifications for preselection continue to apply. The user must now select an alternative door system type 70, 71. In a further step, the installer then receives a message that the data 81, 82 for the alternative door system type 70, 71 is now available for download. Steps 208, 209, 210 can now be repeated.

If the comparison of the list with the door component types of the actually installed door components shows that the correct door component types are present, then in step 211 a unique identifier of the installed door components 33, 34, 35, 36, 37, 38, 39, 51, 52, 53, at least, however, the installed door components 31, 33, 34, 35, 36, 51, 52, 53, which are connected to the first and/or third bus system 32, 55, is stored in the third database 22 as belonging to the door system 60, 61. The identifiers of the door components can be assigned to the identifier of the door system 60, 61 or to the installation location on the digital building plan.

It can be provided that before the door components 33, 34, 35, 36, 37, 38, 39, 51, 52, 53 are installed, the unique identifier is already stored in the computing unit 10. The unique identifier can be linked to other features of the door component, for example the production location and the production date. As a result, the computing unit always knows which door component is installed at which installation location.

If each door component type 40, 41, 44, 45, 46 is present only once in the door system 60, as in the exemplary embodiment of FIG. 1, then at least the door components 33, 35, 51, 52, 53, which are connected to the first bus system 32, report both the door component type 40, 41, 44, 45, 46 and the unique identifier to the control unit 30. The control unit 30 then automatically sends the door component types and the assigned unique identifiers to the computing unit 10 via the mobile terminal 50 or via the second bus system 25. In addition, the control unit 30 sends its own unique identifier to computing unit 10. The assignments are stored in the third database 22 in the computing unit 10.

If door component types 40, 41, 44, 45, 46 are present multiple times in the door system 60, as in the exemplary embodiment of FIG. 2, then the assignment is carried out by an input on the mobile terminal 50. For this purpose, the unique identifiers of the door components 35, 36 present multiple times are displayed on the mobile terminal 50. In addition, the door component types 41 and the provided positions are displayed on the mobile terminal 50. For example, the two unique identifiers "348.413" and "359.127" and the terms "motorized door drive active leaf" and "motorized door drive passive leaf" are displayed. The installer can select an identifier. The associated door component 35, 36 then outputs a visual and/or acoustic sign. The installer can use the visual and/or acoustic sign to identify the position at which the selected door component 35, 36 is located, in this example whether the selected door component is the door drive 35, 36 of the active leaf or the passive leaf. By way of an input on the mobile terminal 50, the installer can make the assignment, e.g. assign the identifier "348.413" to the "motorized door drive active leaf".

Alternatively, the unique identifiers of each door component that is in communication with the control unit 30 are assigned through an input on the mobile terminal 50, as described above.

Deviating from the exemplary embodiment described, it can be provided that not every deviation of the actually installed door components from the list results in an alternative door system type 70, 71 having to be determined for the installation location. Rather, it is conceivable, in particular in the case of mechanically different door components or higher-quality door components, that step 211 nevertheless follows step 210.

Deviating from the exemplary embodiment described, it may be that the installer may store additional information in the third database 22. This information relates, for example, to the spatial dimensions of the door components used.

The invention claimed is:

1. A method for installing a plurality of door components as a door system, wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein a door component is designed as a control unit, wherein the electronic configuration of the door system is stored in the control unit and/or wherein further door components belong to at least one door component group of the following door component groups:

motorized door drive, locking element, signal transmitter for opening, stopping, closing, locking or unlocking a door, detection unit for receiving an access attribute.

2. The method according to claim 1, wherein, if the user input comprises the use of a hazardous situation, in step a. only the at least one door system type is made available for selection, which fulfills a specification for the hazardous situation at the installation location, which serves to protect human life.

3. The method according to claim 1, wherein the control unit has knowledge of door component types actually installed in the door system by registering further door components with the control unit by specifying the door component type.

4. The method according to claim 1, wherein prior to step a., an identifier of the installed door component is stored in the access system, in a computing unit, together with at least one other feature of the door component, wherein at the end of the installation, the identifier of installed door components is assigned to an identifier of the door system and stored in the computing unit.

5. A method for installing a plurality of door components as a door system wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein prior to step a., a digital building plan is read into the electronic configuration system, wherein after step a., the selected door system types are assigned to different installation locations, wherein the configuration system verifies electronically whether the selected door system types are consistent with the installation location or are consistent with door system types that are on a walkable route on the building plan.

6. A method for installing a plurality of door components as a door system wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein the same door system type is automatically provided by the configuration system for further doors of a spatial region in step a., wherein the type of provision indicates to the selecting user that the door system type has already been used, and/or wherein a reduced number of door system types are available for preselection for a user or a user group through the electronic configuration system.

7. A method for installing a plurality of door components as a door system wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein the electronic configuration system comprises a plurality of authorization levels, wherein each user is assigned to an authorization level, wherein at least two of the following authorization levels are provided:

a first authorization level that allows a new door system type to be created, a second authorization level that allows a preconfigured door system type to be selected and/or user specifications to be set, but not a new door system type to be created, and a third authorization level that allows data of the selected door system type to be retrieved, but not the door system type to be selected, user specifications to be set or a new door system type to be created, wherein the authorization levels are defined in the electronic configuration system, wherein the authorization levels are linked to an authentication of the user.

8. A method for installing a plurality of door components as a door system wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein the preconfigured technical data that is made available in step b. is stored in a database linked to the door system type and is stored in a database, wherein the preconfigured data relates to a plurality of door components of the door system, wherein the preconfigured data is configured to be viewed and/or downloaded from the database upon input by a user, wherein the input contains the door system type or information that is linked to the door system type, an installation location or an identifier of the door system.

9. A method for installing a plurality of door components as a door system wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein the preconfigured data comprises a circuit diagram of the door system, wherein the circuit diagram is configured to be viewed and/or downloaded from the configuration system and/or from a database onto a mobile terminal, wherein an installation location on a digital building plan, the door system type or an identifier of the door system is input into the mobile terminal.

10. A method for installing a plurality of door components as a door system, wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein the electronic configuration comprises at least one of the following electronic data:

provided door component types of the door system transmitters and/or receivers of messages within the door system, functional processes of the door system, in which a plurality of processes are to be carried out in a specified order, wherein the electronic configuration comprises a computer program product or instructions for executing a computer program product, by means of which the functional process can be controlled, parameters for operating the door system, and a test process for the door system, in which at least one function or a functional process of the door system is tested for commissioning.

11. A method for installing a plurality of door components as a door system, wherein the method includes at least the following steps:

a. providing at least one preconfigured door system type by way of an electronic configuration system for selection by a user, wherein the at least one preconfigured door system type is configured to be retrieved from a database by the electronic configuration system, wherein at least one preconfigured door system type is configured to be preselected by the electronic configuration system by way of at least one technical and/or functional user specification, wherein the door system type comprises a plurality of defined door component types, and b. electronic provision of preconfigured technical data of the selected door system type in order to carry out the installation on site, wherein the data comprises an electronic configuration of the door system, wherein an access system has knowledge of the door component types actually installed in the door system and compares it with provided door component types of the door system in the electronic configuration, wherein if the installed door components types deviate from the provided door component types, it is predefined in an electronically stored manner how the installation process is to be continued.

12. The method according to claim 11, wherein the start-up of an operation of the door system is electronically prevented in the event of a defined deviation, wherein, if there is a defined deviation, the use of an alternative door system type corresponds to the actually installed door component types is checked in the configuration system, wherein the installed door components are then installed as part of the alternative door system type with the electronic configuration of the alternative door system type.

13. A non-transitory information carrier storing a computer program product, the computer program product configured for carrying out the method according to any of claims 1, 6 to 9, 10 to 12.

14. A computer system configured for carrying out the method according to any of claims 1, 6 to 9, 10 to 12.

* * * * *